US010331252B2

(12) United States Patent
Huang et al.

(10) Patent No.: US 10,331,252 B2
(45) Date of Patent: Jun. 25, 2019

(54) TOUCH SCREEN, DISPLAY DEVICE AND METHOD OF DRIVING TOUCH SCREEN

(71) Applicants: BOE Technology Group Co., Ltd., Beijing (CN); Chengdu BOE Optoelectronics Technology Co., Ltd., Chengdu (CN)

(72) Inventors: Weiyun Huang, Beijing (CN); Zhonglin Cao, Beijing (CN); Ting Li, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 42 days.

(21) Appl. No.: 15/545,196

(22) PCT Filed: Jan. 23, 2017

(86) PCT No.: PCT/CN2017/072179
§ 371 (c)(1),
(2) Date: Jul. 20, 2017

(87) PCT Pub. No.: WO2017/202053
PCT Pub. Date: Nov. 30, 2017

(65) Prior Publication Data
US 2018/0217706 A1 Aug. 2, 2018

(30) Foreign Application Priority Data
May 27, 2016 (CN) .......................... 2016 1 0363448

(51) Int. Cl.
G06F 3/041 (2006.01)
H01L 27/12 (2006.01)
(Continued)

(52) U.S. Cl.
CPC .......... G06F 3/0412 (2013.01); G06F 3/0416 (2013.01); H01L 27/124 (2013.01);
(Continued)

(58) Field of Classification Search
CPC ............................. G06F 3/044; G06F 3/03547
See application file for complete search history.

(56) References Cited

U.S. PATENT DOCUMENTS 9,372,583 B2 6/2016 Kim et al.
2014/0049508 A1 2/2014 Kim et al.
(Continued)

FOREIGN PATENT DOCUMENTS

CN 101957507 A 1/2011
CN 103594050 A 2/2014
(Continued)

OTHER PUBLICATIONS

International Search Report and Written Opinion for International Application No. PCT/CN2017/072179, dated May 2, 2017, 10 pages.
(Continued)

Primary Examiner — Roy P Rabindranath
(74) Attorney, Agent, or Firm — Westman, Champlin & Koehler, P.A.

(57) ABSTRACT

Embodiments of the present disclosure relate to a touch screen, a display device, and a method of driving a touch screen. The touch screen comprises: an array substrate having a common electrode layer; a display driving unit configured to provide a common electrode driving signal to the common electrode layer; a touch driving unit configured to provide a touch electrode driving signal to the common electrode layer, wherein the array substrate further comprises a first switching unit configured to switch so as to output the common electrode driving signal to the common
(Continued)

electrode layer. The touch screen further comprises a second switching unit configured to output the touch electrode driving signal generated by the touch driving unit to the common electrode layer. The common electrode driving signal and the touch electrode driving signal are time-division output to the common electrode layer.

16 Claims, 7 Drawing Sheets

(51) Int. Cl.
*H05K 1/18* (2006.01)
*G06F 3/044* (2006.01)

(52) U.S. Cl.
CPC ....... *H05K 1/189* (2013.01); *G02F 2201/121* (2013.01); *G06F 3/044* (2013.01); *G06F 2203/04104* (2013.01)

(56) References Cited

U.S. PATENT DOCUMENTS

| | | | | |
|---|---|---|---|---|
| 2014/0368446 | A1* | 12/2014 | Chang | G06F 3/0412 345/173 |
| 2015/0185941 | A1 | 7/2015 | Lee et al. | |
| 2016/0019827 | A1 | 1/2016 | Lee et al. | |
| 2016/0147343 | A1* | 5/2016 | Zhou | G06F 3/0412 345/173 |
| 2016/0202829 | A1* | 7/2016 | Choi | G06F 3/044 345/174 |
| 2016/0291784 | A1* | 10/2016 | Zhai | G06F 3/0416 |
| 2016/0328075 | A1 | 11/2016 | Luo | |
| 2017/0212623 | A1* | 7/2017 | Park | G02F 1/133345 |

FOREIGN PATENT DOCUMENTS

| | | |
|---|---|---|
| CN | 104750339 A | 7/2015 |
| CN | 104777942 A | 7/2015 |
| CN | 105159490 A | 12/2015 |
| CN | 106055151 A | 10/2016 |

OTHER PUBLICATIONS

English translation of International Search Report and Box. V of the Written Opinion for International Application No. PCT/CN2017/072179, dated May 2, 2017, 5 pages.

First Office Action, including Search Report, for Chinese Patent Application No. 201610363448.9, dated Apr. 27, 2018, 16 pages.

\* cited by examiner

TOUCH SCREEN, DISPLAY DEVICE AND METHOD OF DRIVING TOUCH SCREEN

CROSS-REFERENCE TO RELATED APPLICATION(S)

This application is a U.S. National Phase Application of International Application No. PCT/CN2017/072179, filed on Jan. 23, 2017, entitled "TOUCH SCREEN, DISPLAY DEVICE AND METHOD OF DRIVING TOUCH SCREEN," which claims priority to Chinese Application No. 201610363448.9 filed on May 27, 2016, both of which are incorporated herein by reference in their entirety.

TECHNICAL FIELD

Embodiments of the present disclosure relate to touch screen technology, and more particularly, to a touch screen, a display device, and a method of driving a touch screen.

BACKGROUND

Touch screen, especially In-Cell touch screen technology, promotes integration of touch and control of a screen. Time-division driving of common electrodes results in that both a display integrated circuit (IC) chip and a touch IC chip need to be customized, and compatibility between the ICs of respective manufacturers is significantly reduced.

SUMMARY

Embodiments of the present disclosure provide a touch screen, a display device, and a method of driving a touch screen.

According to an aspect of the present disclosure, a touch screen is provided. The touch screen comprises:

an array substrate having a common electrode layer;

a display driving unit configured to provide a common electrode driving signal;

a touch driving unit configured to provide a touch electrode driving signal, wherein the array substrate further comprises a first switching unit configured to switch so as to output the common electrode driving signal to the common electrode layer; and the touch screen further comprises a second switching unit configured to output the touch electrode driving signal generated by the touch driving unit to the common electrode layer, wherein the common electrode driving signal and the touch electrode driving signal are time-division output to the common electrode layer.

Preferably, the first switching unit comprises a plurality of first thin film transistors, a control terminal of each of the first thin film transistors being connected to a first terminal of the display driving unit configured to receive a common electrode switching signal from the display driving unit, an input terminal of each of the first thin film transistors being connected to a second terminal of the display driving unit configured to receive the common electrode driving signal from the display driving unit, and an output terminal of each of the first thin film transistors being connected to the common electrode layer and to an output terminal of the touch driving unit.

Preferably, the touch screen according to an embodiment of the present disclosure further comprises a timing control unit configured to provide a timing control signal to the display driving unit and the touch driving unit respectively, so as to synchronize the display driving unit with the touch driving unit.

Preferably, the display driving unit, the touch driving unit and the timing control unit are integrated and arranged outside the array substrate, and are connected to the array substrate by bonding through a flexible printed circuit board.

Preferably, the second switching unit and the display driving unit are arranged on the array substrate.

Preferably, the touch driving unit and the timing control unit are integrated and arranged outside the array substrate, and are connected to the array substrate by bonding through a flexible printed circuit board.

Preferably, the second switching unit comprises a plurality of second thin film transistors, a control terminal of each of the second thin film transistors receiving a touch electrode switching signal from the display driving unit, an input terminal of each of the second thin film transistors receiving a respective one of a plurality of touch electrode driving signals generated by the touch driving unit, and an output terminal of each of the second thin film transistors being connected to the common electrode layer.

Preferably, a magnitude of the touch electrode driving signal is dependent on a magnitude of the common electrode driving signal.

According to another aspect of the present disclosure, a display device is provided, comprising a touch screen according to the embodiments of the present disclosure.

According to yet another aspect of the present disclosure, a driving method applied to the touch screen according to the embodiments of the present disclosure is provided, comprising:

turning on the first switching unit and turning off the second switching unit during a display period of each frame displayed by the touch screen, and outputting the common electrode driving signal to the common electrode layer in order to perform display screen refresh on the touch screen; and turning off the first switching unit and turning on the second switching unit during a touch period of each frame displayed by the touch screen, and outputting the touch electrode driving signal to the common electrode layer in order to perform touch scan on the touch screen.

BRIEF DESCRIPTION OF THE DRAWINGS

The foregoing and other objects, features and advantages of the embodiments of the present disclosure will be more apparent from the following description of exemplary embodiments of the present disclosure when taken in conjunction with the accompanying drawings in which.

DETAILED DESCRIPTION

Figure 1:
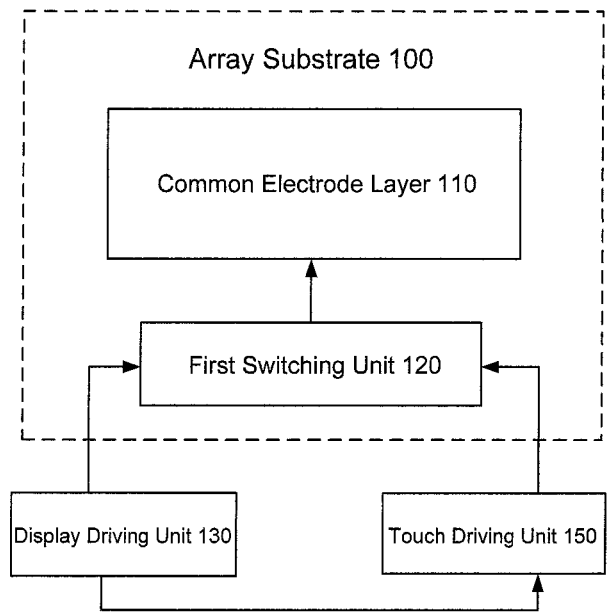
FIG. 1 shows a schematic diagram of a structure of a touch screen according to an embodiment of the present disclosure.

Hereinafter, the embodiments of the present disclosure will be described in detail with reference to the drawings. It should be noted that throughout the drawings, the same elements are denoted by the same or similar reference numbers. In the following description, some particular embodiments are for illustrative purposes only and are not to be construed as limiting the present disclosure, but merely examples of the embodiments of the present disclosure. The conventional structure or configuration will be omitted when it may cause confusion with the understanding of the present disclosure. It should be noted that shapes and dimensions of the components in the drawings do not reflect real sizes and scales, but only exemplarily show contents of the embodiments of the present disclosure.

It is to be understood by the skilled in the art that the description "A and B are connected" and "A is connected to B" herein may mean that A is directly connected to B, or A is connected to B via one or more other components. In addition, "being connected" and "being connected to" herein may be physically electrically connected, or may be electrically coupled.

It will be appreciated by the skilled in the art that the switch transistors used in all of the embodiments of the present disclosure may be thin film transistors or field effect transistors or other devices having the same characteristics. Preferably, the thin film transistor used in the embodiments of the present disclosure may be an oxide semiconductor transistor. As used herein, the term "control terminal" refers to a gate of a transistor, "input terminal" refers to one of a source and a drain of a transistor, and "output terminal" refers to the other of the source and the drain of the transistor. Because the source and the drain of the switch transistor used herein are symmetrical, the source and the drain are interchangeable.

FIG. 1 shows a schematic diagram of a structure of a touch screen according to an embodiment of the present disclosure. As shown in FIG. 1, the touch screen according to the embodiment of the present disclosure comprises: an array substrate 100 having a common electrode layer 110; a display driving unit 130 configured to provide a common electrode driving signal to the common electrode layer during a display period; a touch driving unit 150 configured to provide a touch electrode driving signal to the common electrode layer during a touch period, wherein the array substrate further comprises a first switching unit 120 configured to switch so as to output the common electrode driving signal to the common electrode layer, wherein the common electrode driving signal and the touch electrode driving signal are time-division output to the common electrode layer, so as to perform display driving and touch driving of the touch screen.

Figure 2:
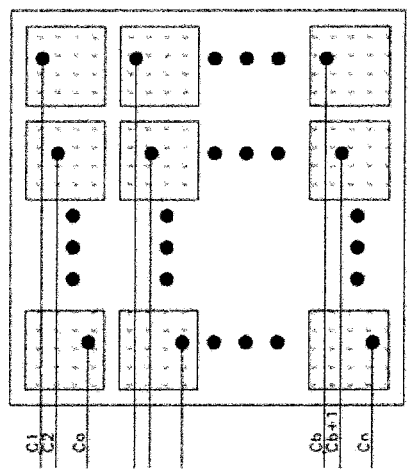
FIG. 2 is a schematic diagram of division of a common electrode layer of a self-capacitance touch screen.
Figure 3:
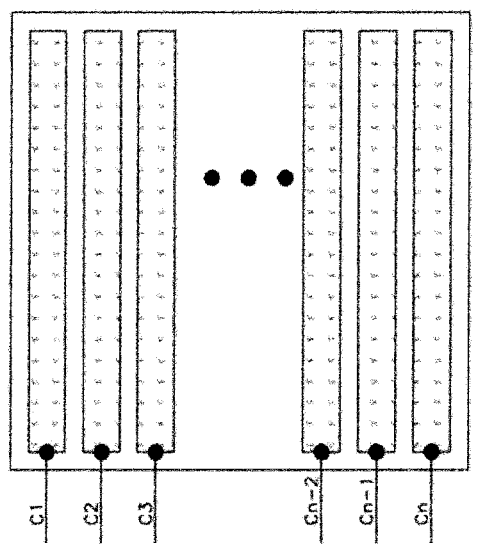
FIG. 3 is a schematic diagram of division of a common electrode layer of a mutual-capacitance touch screen.

Typically, a common electrode of the common electrode layer of the array substrate is divided into a plurality of sub-electrodes arranged in an array. FIG. 2 shows a schematic diagram of division of a common electrode layer of a self-capacitance touch screen, and FIG. 3 shows a schematic diagram of division of a common electrode layer of a mutual-capacitance touch screen. As shown in FIGS. 2 and 3, the first switching unit 120 may be connected to an array of n sub-electrodes through metal leads C1, C2, . . . , Cn respectively, where n is an integer greater than one. It may be understood by the skilled in the art that the embodiment of the present disclosure is not limited to the division approaches as shown in FIGS. 2 and 3, and the common electrode layer may be divided into an array of a plurality of sub-electrodes in a number of other ways. Although not shown, the leads C1, C2, . . . , Cn may be connected to the respective sub-electrodes according to various methods well-known in the art. For example, the leads C1, C2, . . . , Cn may be connected to the respective sub-electrodes by physical connections and/or electrical connections, respectively.

Figure 4:
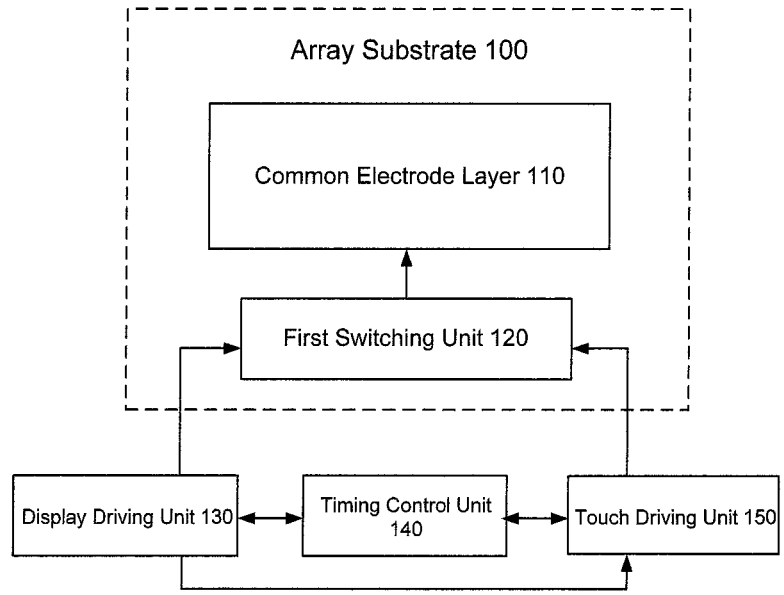
FIG. 4 shows a schematic diagram of a structure of a touch screen according to another embodiment of the present disclosure.

FIG. 4 shows a schematic diagram of a structure of a touch screen according to another embodiment of the present disclosure. The touch screen as shown in FIG. 4 differs from that as shown in FIG. 3 in that the touch screen in FIG. 4 further comprises a timing control unit 140 configured to provide a timing control signal to the display driving unit 130 and the touch driving unit 150 respectively.

Figure 5:
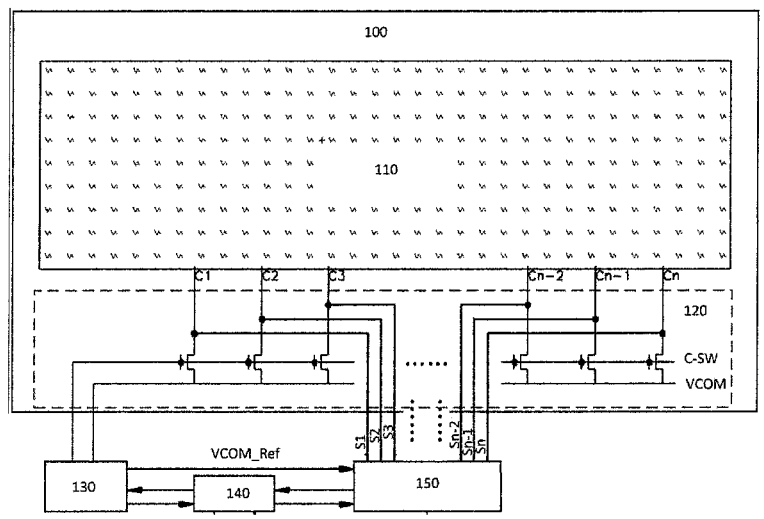
FIG. 5 shows a schematic diagram of a touch screen according to an embodiment of the present disclosure.

FIG. 5 shows a schematic diagram of a touch screen according to an embodiment of the present disclosure. As shown in FIG. 5, the touch screen according to the embodiment of the present disclosure may comprise an array substrate 100 on which a common electrode layer 110 and a first switching unit 120 are arranged. The first switching unit 120 may comprise a plurality of thin film transistors, a control terminal of each of the thin film transistors being connected to a first terminal of the display driving unit 130 for receiving a common electrode switching signals C-SW from the display driving unit 130; an input terminal of each of the thin film transistors being connected to a second terminal of the display driving unit 130 for receiving a common electrode driving signal VCOM from the display driving unit 130; an output terminal of each of the thin film transistors being connected to the respective sub-electrodes via C1, C2, . . . , Cn, respectively, and being connected to respective output terminals S1, S2, . . . Sn of the touch driving unit 150 respectively. For convenience of description, the thin film transistor included in the first switching unit 120 may be referred to as a "first thin film transistor".

In FIG. 5, a NMOS thin film transistor is taken as an example of the switch transistor for illustration. It may be understood by the skilled in the art that the switch transistor may also be a PMOS thin film transistor, and in this case, polarities of a gate control signal are changed accordingly. In the example of FIG. 5, a source (the input terminal) of the thin film transistor receives the common electrode driving signal VCOM from the display driving unit 130, and a drain (the output terminal) of the thin film transistor is connected to the respective one of C1, C2, ..., Cn, and a gate (the control terminal) of the thin film transistor receives the common electrode switching signal C-SW (Com Switch) from the display driving unit 130. The plurality of switch transistors may be arranged on the array substrate, so that the plurality of switch transistors may be manufactured by the process same as driving the thin film transistor of the TFT pixels of the array substrate.

As shown in FIG. 5, C1, C2, ..., Cn are each divided into two paths, one being connected to a corresponding switch transistor, the other being respectively connected to the touch electrode driving signals S1, S2, ..., Sn of the touch driving unit 150 (which are collectively referred to as S-Puls hereinafter when no distinction is required) one by one. The connections between C1 and S1, C2 and S2, ... Cn and Sn may be achieved by IC bonding through a touch IC chip which implements the touch driving unit 150, or by bonding through a flexible printed circuit board FPC.

By adjusting a voltage value of the common electrode driving signal VCOM which is output from the display driving unit 130, the display screen may achieve an optimal display effect, and the VCOM voltage value at this time is marked as VCOM_Ref. The voltage value VCOM_Ref may be synchronized to the touch driving unit 150. A voltage magnitude of the touch electrode driving signal S-Puls which is generated by the touch driving unit 150 may be dependent on to the voltage value of the common electrode driving signal VCOM. Specifically, the voltage value VCOM_Ref may be used as a low voltage of the touch electrode driving signal S-Puls. In addition, the timing control unit 140 provides timing control signals, such as a horizontal synchronization signal HSYNC and a vertical synchronizing signal VSYNC, to the display driving unit 130 and the touch driving unit 150 respectively for performing signal synchronization between the display driving unit 130, the touch driving unit 140, and the system IC (not shown).

Figure 6:
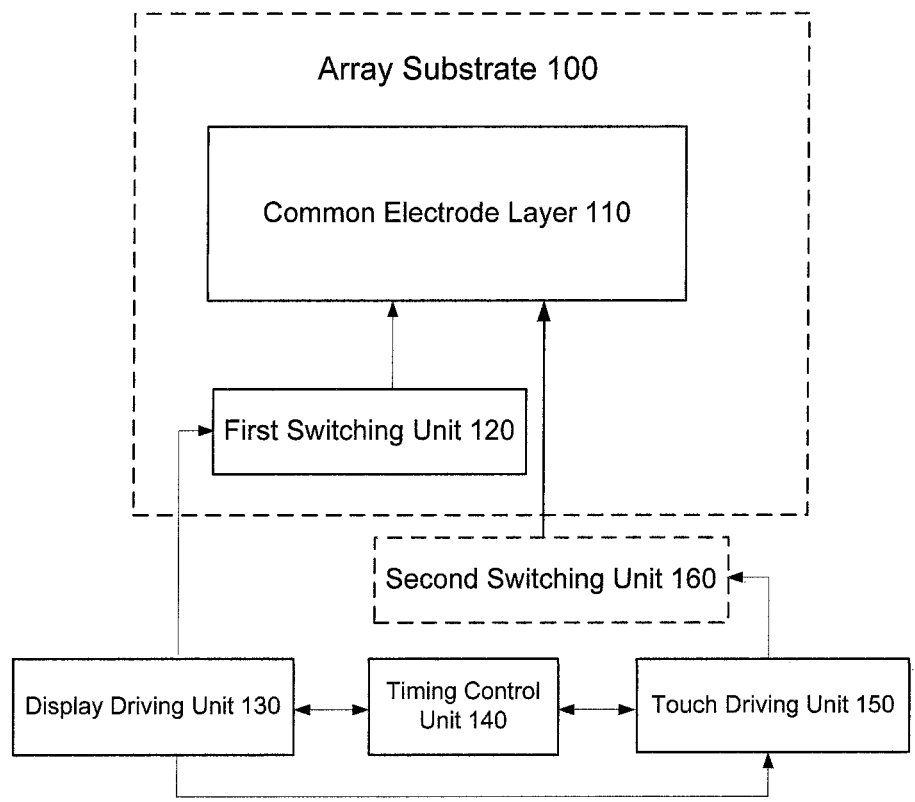
FIG. 6 shows a schematic view of a structure of a touch screen according to yet another embodiment of the present disclosure.

FIG. 6 shows a schematic diagram of a structure of a touch screen according to another embodiment of the present disclosure. The touch screen as shown in FIG. 6 differs from those as shown in FIGS. 3 and 4 in that the touch screen in FIG. 6 further comprises a second switching unit 160 configured to output the touch electrode driving signal generated by the touch driving unit 150 to the corresponding sub-electrode via the second switching unit 160.

Figure 7A:
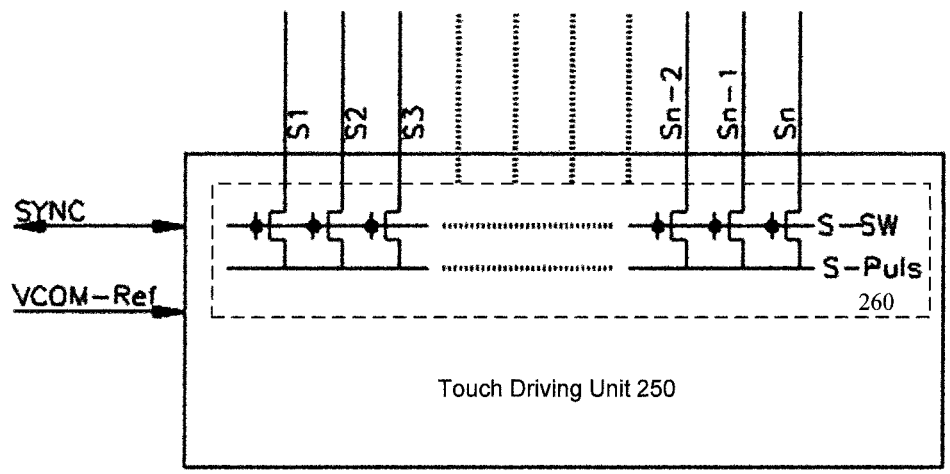
FIG. 7A is a schematic diagram of a structure of a touch unit according to an embodiment of the present disclosure.
Figure 7B:
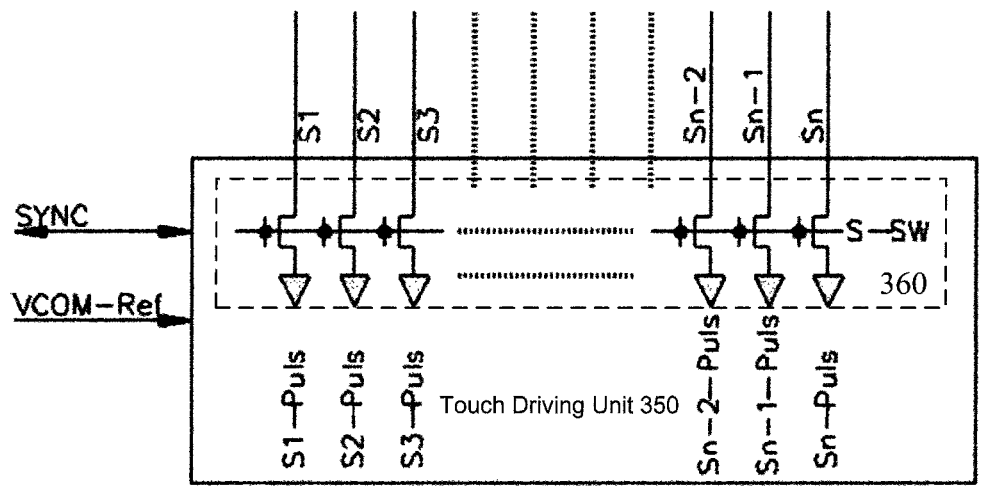
FIG. 7B is a schematic diagram of a structure of a touch unit according to another embodiment of the present disclosure.

Although the second switching unit 160 is shown separately in FIG. 6, it may also be included in the touch driving unit 150. FIG. 7A shows a schematic diagram of a structure of a touch driving unit 250 according to an embodiment of the present disclosure. As shown in FIG. 7A, the touch driving unit 250 comprises a second switching unit 260, which may comprise a plurality of second thin film transistors, a control terminal of each of the second thin film transistors receiving a touch electrode switching signal S-SW from the touch driving unit 250, an input terminal of each of the second thin film transistors receiving the touch electrode driving signal S-Puls which is generated by the touch driving unit 250, and an output terminal of each of the second thin film transistors being connected to the corresponding sub-electrode so as to output the touch electrode driving signal S-Puls. FIG. 7A shows such a case that the touch driving approach is "same driving same check", i.e., using the same touch electrode driving signal S-Puls. Preferably, the voltage value of VCOM_Ref from the display driving unit 130 may be used as a low voltage of the touch electrode driving signal S-Puls. A synchronization signal SYNC is generated by the timing control unit 140, and the synchronization signal SYNC may include a horizontal synchronization signal HSYNC and a vertical synchronization signal VSYNC. FIG. 7B shows a schematic diagram of a structure of a touch driving unit 350 according to another embodiment of the present disclosure. As shown in FIG. 7B, the touch driving unit 350 comprises a second switching unit 360. FIG. 7B differs from FIG. 7A in that the touch driving approach as shown in FIG. 7B is "driving sequentially", i.e., using respective ones of the plurality of touch electrode driving signals S1-Puls, S2-Puls, ..., Sn-Puls sequentially in time.

According to the embodiment of the present disclosure, by arranging the first switching unit and optically the second switching unit on the array substrate, the compatibility may be maintained not only with the original display IC but also with the touch ICs of various manufacturers, which facilitates to reduce a technology risk in product development, while to simplify a control circuit for the touch IC, thereby reducing IC costs. In addition, since the first switching unit and the second switching unit which comprise the plurality of thin film transistors are integrated on the array substrate, the same process may be used to form the pixel driving thin film transistors in the array substrate and the thin film transistors in the switching units together, thereby further reducing the costs.

Figure 8A:
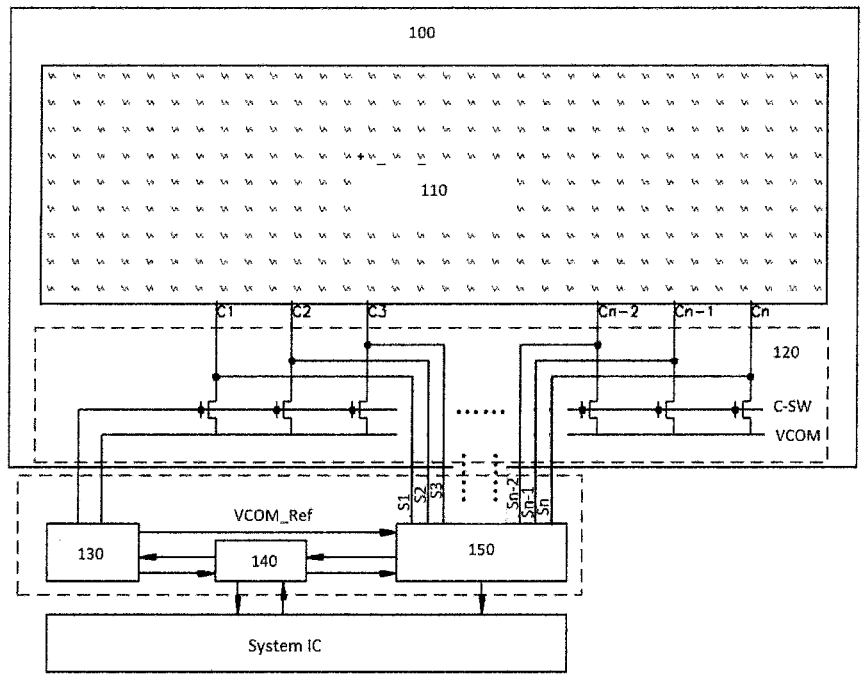
FIG. 8A is a schematic diagram of integration of a touch screen according to an embodiment of the present disclosure.

FIG. 8A shows a schematic diagram of integration of a touch screen according to an embodiment of the present disclosure. As shown in FIG. 8A, the touch screen according to the embodiment of the present disclosure may comprise: an array substrate 100; a first switching unit 120 and a common electrode layer 110 arranged on the array substrate 100; and a display driving unit 130, a touch driving unit 150, and a timing control unit 140 integrated and arranged outside the array substrate 100. Since the display driving unit 130 (which may be implemented by a display IC "D-IC"), the timing control unit 140 (which may be implemented by a timing control IC "T-Con") and the touch driving unit 150 (which may be implemented by a touch IC "T-IC") are integrated in a single IC, the scheme may be referred to as a TDDI (Touch and Display Driver Integration) scheme. The single IC may be connected to the array substrate 100 by IC bonding or FPC board bonding.

Figure 8B:
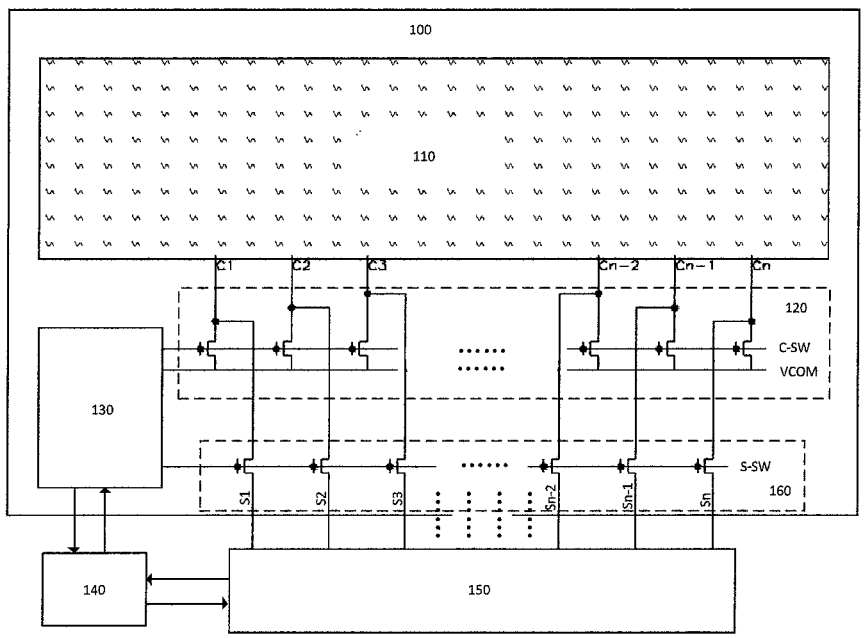
FIG. 8B is a schematic diagram of integration of a touch screen according to another embodiment of the present disclosure.

FIG. 8B shows a schematic diagram of integration of a touch screen according to another embodiment of the present disclosure. As shown in FIG. 8B, the touch screen according to the embodiment of the present disclosure may comprise: an array substrate 100, on which a second switching unit 160, a first switching unit 120 and a display driving unit 130 are arranged; and a touch driving unit 150 and a timing control unit 140 arranged outside the array substrate 100. In this case, a touch electrode switching signal S-SW of the second switching unit 160 may be provided by the display driving unit 130, or may be provided by the touch driving unit 150. In an example, the touch driving unit 150 and the timing control unit 140 may also be integrated and arranged outside the array substrate 100 and connected to the array substrate by IC bonding or FPC board bonding.

Figure 9:
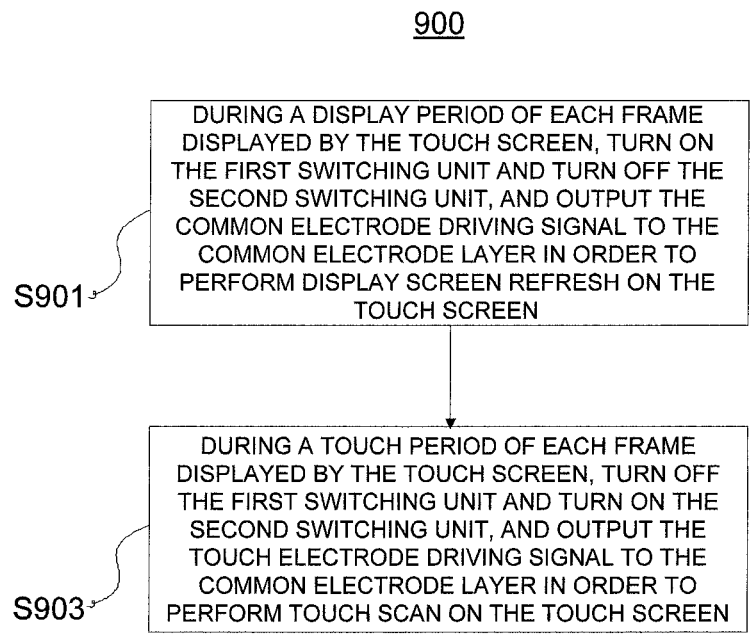
FIG. 9 is a flow chart of a method of driving a touch screen according to an embodiment of the present disclosure.

FIG. 9 is a flow chart of a time-division driving method for a touch screen according to an embodiment of the present disclosure. The time-division driving method may be applied to the touch screen according to the embodiments of the present disclosure. As shown in FIG. 9, the time-division driving method 100 may comprise:

Step S901 of turning on the first switching unit and turning off the second switching unit during a display period of each frame displayed by the touch screen, and outputting the common electrode driving signal to the common electrode layer in order to perform display screen refresh on the touch screen; and Step S903 of turning off the first switching unit and turning on the second switching unit during a touch period of each frame displayed by the touch screen, and outputting the touch electrode driving signal to the common electrode layer in order to perform touch scan on the touch screen.

Figure 10A:
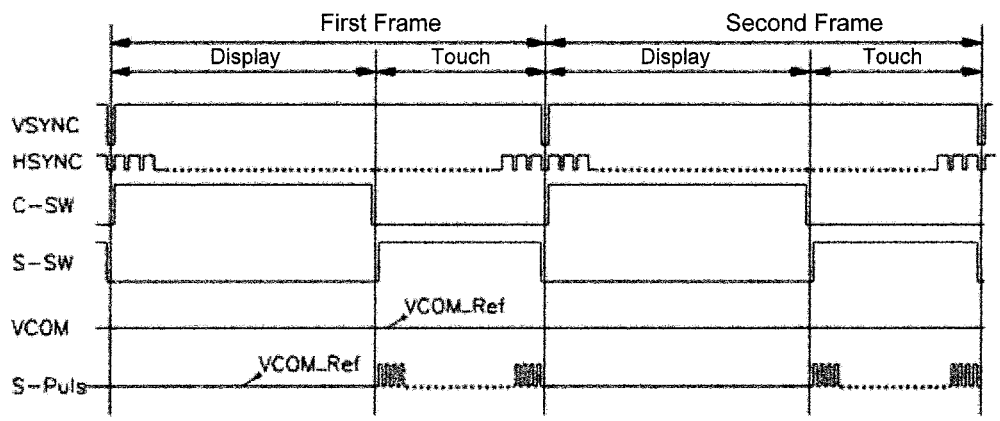
FIG. 10A is a schematic sequence diagram of a time-division control signal of a touch screen according to an embodiment of the present disclosure.
Figure 10B:
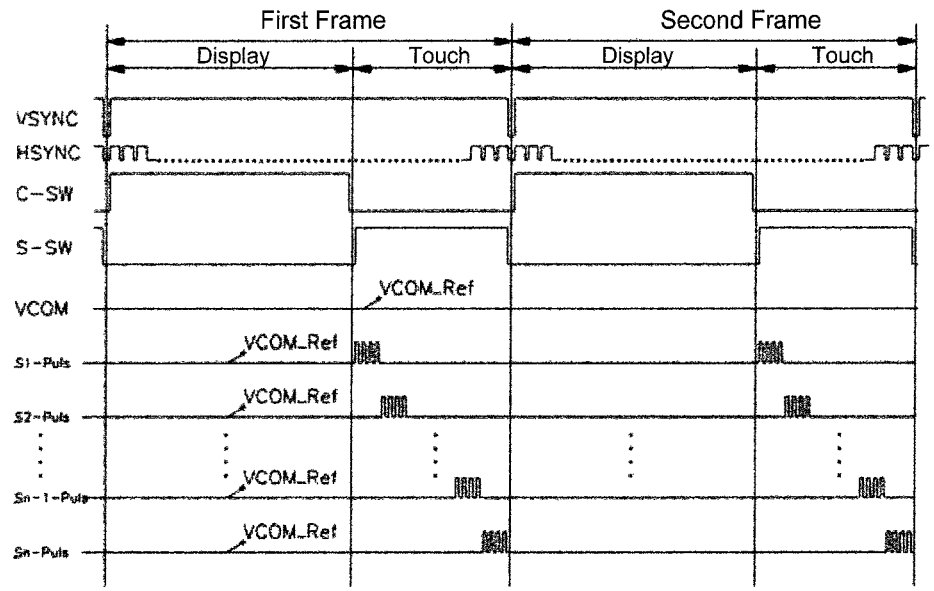
FIG. 10B is a schematic sequence diagram of a time-division control signal of a touch screen according to another embodiment of the present disclosure.
Figure 10C:
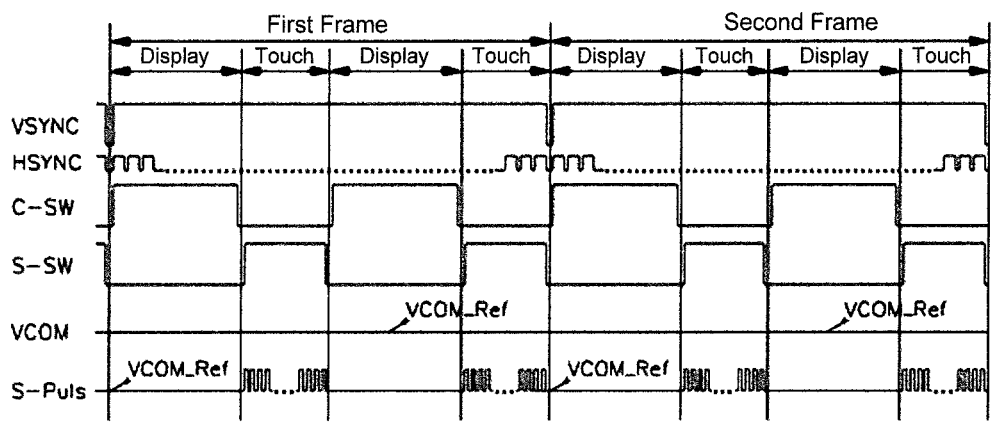
FIG. 10C is a schematic sequence diagram of a time-division control signal of a touch screen according to yet another embodiment of the present disclosure.

Hereinafter, a time-division driving method according to embodiments of the present disclosure will be described in detail with reference to FIGS. 10A to 10C. FIGS. 10A-10C show schematic sequence diagrams of time-division control signals of a touch screen according to different embodiments of the present disclosure respectively. In examples of FIGS. 10A-10C, NMOS thin film transistors are used as switch transistors. In a case that the NMOS thin film transistor is used as the switch transistor, the switch transistor is turned on when the gate is at a high level and is turned off when the gate is at a low level. It may be appreciated by the skilled in the art that a PMOS transistor may also be used as a switch transistor, in which case the switch transistor is turned on when the gate is at a low level and is turned off when the gate is at a high level.

FIG. 10A shows a sequence diagram of a time-division control signal in the case of the self-capacitance touch screen as shown in FIG. 2 which is driven in a way of "same driving same check" and is driven once per frame. In FIG. 10A, VSYNC is a vertical synchronization signal and is generated by the timing control unit 140, and HSYNC is a horizontal synchronization signal and is generated by the timing control unit 140. The display driving unit 130 and the touch driving unit 150 may be synchronized by the synchronization signal using various methods well-known in the art.

A common electrode switching signal C-SW is generated by the display driving unit 130, and a touch electrode switching signal S-SW is generated by the display driving unit 130 or the touch driving unit 150. The display driving unit 130 generates a common electrode driving signal VCOM. In the example of FIG. 10A, a voltage value of the VCOM may be equal to VCOM-Ref. The touch driving unit 150 generates a touch electrode driving signal S-Puls, and VCOM_Ref may be used as a low voltage of the touch electrode driving signal S-Puls. It can be seen that the same touch electrode driving signal S-Puls is used in the example of FIG. 10A. As shown in FIG. 10A, each frame may be divided into a "display" period and a "touch" period. During the "display" period of each frame, the C-SW signal is at a high voltage, and thus the first switching unit is turned on; the S-SW signal is at a low voltage, and thus the second switching unit is turned off. At this time, C1, C2, . . . , Cn are connected to the VCOM signal and disconnected from the S-Puls signal. Thus, display screen refresh is performed on the touch screen. During the "touch" period of each frame, the C-SW signal is at a low voltage, and thus the first switching unit is turned off; the S-SW signal is at a high voltage, and thus the second switching is turned on. At this time, C1, C2, . . . Cn are disconnected from the VCOM signal and connected to the S-puls signal. Thus, touch scan is performed on the touch screen.

FIG. 10B shows a sequence diagram of a time-division control signal in the case of the mutual-capacitance touch screen as shown in FIG. 3 which is driven in a way of "driving sequentially" and is driven once per frame. Similar with FIG. 10A, in FIG. 10B, VSYNC is a vertical synchronization signal, and HSYNC is a horizontal synchronization signal, both of which are generated by the timing control unit 140. The display driving unit 130 and the touch driving unit 150 may be synchronized by the corresponding synchronization signal.

Different from the example in FIG. 10A, a plurality of different touch control electrode driving signals S1-Puls, S2-Puls, . . . , Sn-Puls are used in FIG. 10B. Similarly, VCOM_Ref may be used as a low voltage of the touch electrode driving signal S-Puls. As shown in FIG. 10B, each frame displayed may be divided into a "display" period and a "touch" period. During the "display" period of each frame, the C-SW signal is at a high voltage, and thus the first switching unit is turned on; the S-SW signal is at a low voltage, and thus the second switching unit is turned off. At this time, C1, C2, . . . , Cn are connected to the VCOM signal and disconnected from the corresponding Si-Puls signal. Thus, display screen refresh is performed on the touch screen. Here, i is an integer no less than 1 and no more than n. During the "touch" period of each frame, the C-SW signal is at a low voltage, and thus the first switching unit is turned off; the S-SW signal is at a high voltage, and thus the second switching is turned on. At this time, C1, C2, . . . Cn are disconnected from the VCOM signal and connected to the Si-puls signal. Thus, touch scan is performed on the touch screen.

FIG. 10C shows a sequence diagram of a time-division control signal in the case of the self-capacitance touch screen as shown in FIG. 2 which is driven in a way of "same driving same check" and is driven twice per frame. Similar with FIG. 10A, in FIG. 10C, VSYNC is a vertical synchronization signal, and HSYNC is a horizontal synchronization signal, both of which are generated by the timing control unit 140. The display driving unit 130 and the touch driving unit 150 may be synchronized by the corresponding synchronization signal.

Different from the example in FIG. 10A, each frame in FIG. 10C may be divided into four periods: a "display" period, a "touch" period, a "display" period and a "touch" period. During the first "display" period of each frame, the C-SW signal is at a high voltage, and thus the first switching unit is turned on; the S-SW signal is at a low voltage, and thus the second switching unit is turned off. At this time, C1, C2, . . . , Cn are connected to the VCOM signal and disconnected from the S-Puls signal. Thus, display screen refresh is performed on the touch screen. During the first "touch" period of each frame, the C-SW signal is at a low voltage, and thus the first switching unit is turned off; the S-SW signal is at a high voltage, and thus the second switching is turned on. At this time, C1, C2, . . . Cn are disconnected from the VCOM signal and connected to the S-puls signal. Thus, touch scan is performed on the touch screen. Subsequently, during the second "display" period of each frame, the C-SW signal is at a high voltage, and thus the first switching unit is turned on; the S-SW signal is at a low voltage, and thus the second switching unit is turned off. At this time, C1, C2, . . . , Cn are connected to the VCOM signal and disconnected from the S-Puls signal. Thus, display screen refresh is performed on the touch screen. During the second "touch" period of each frame, the C-SW signal is at a low voltage, and thus the first switching unit is turned off; the S-SW signal is at a high voltage, and thus the second switching is turned on. At this time, C1, C2, . . . Cn are disconnected from the VCOM signal and connected to the S-puls signal. Thus, touch scan is performed on the touch screen.

According to the embodiment of the present disclosure, by arranging the first switching unit on the array substrate, the compatibility may be maintained not only with the original display IC but also with the touch ICs of various manufacturers, which facilitates to reduce the technology risk in the product development, while to simplify the control circuit for the touch IC, thereby reducing the IC costs. In addition, the traditional time-division driving circuit is typically arranged in the touch IC, while according to the embodiments of the present disclosure, by arranging the first switching unit on the array substrate and reducing the control circuit of the touch IC, a yield rate of the touch IC may be improved, a size of the IC may be decreased, and the IC costs may be reduced. In addition, since the switching unit which comprises the plurality of thin film transistors is integrated on the array substrate, the same process may be used to form the pixel driving thin film transistors in the array substrate and the thin film transistors in the switching unit together, thereby further reducing the costs.

It will be apparent to the skilled in the art that the embodiments of the present disclosure are not limited to the above three particular timing control approaches, and a variety of other control sequences may be applied without departing from the protection scope of the embodiments of the present disclosure.

The touch screen provided according to the embodiments of the present disclosure has been described in detail. In addition, an embodiment of the present disclosure further provides a display device comprises the above-described touch screen. The present disclosure has been described in connection with the preferred embodiments. It should be understood that various other modifications, substitutions and additions may be made by the skilled in the art without departing from the spirit and scope of the present disclosure. Accordingly, the scope of the present disclosure is not limited to the particular embodiments as described above, but should be defined by the appended claims.

We claim:

1. A touch screen, comprising:
an array substrate having a common electrode layer;
a display driving unit configured to provide a common electrode driving signal;
a touch driving unit configured to provide a touch electrode driving signal,
wherein the array substrate further comprises a first switching unit configured to switch so as to output the common electrode driving signal to the common electrode layer,
the touch screen further comprises a second switching unit configured to output the touch electrode driving signal provided by the touch driving unit to the common electrode layer, wherein the common electrode driving signal and the touch electrode driving signal are time-division output to the common electrode layer,
wherein the second switching unit comprises a plurality of second thin film transistors, a control terminal of each of the second thin film transistors receiving a touch electrode switching signal from the display driving unit, an input terminal of each of the second thin film transistors receiving a respective one of a plurality of touch electrode driving signals generated by the touch driving unit, and an output terminal of each of the second thin film transistors being connected to the common electrode layer.

2. The touch screen according to claim 1, wherein the first switching unit comprises a plurality of first thin film transistors, a control terminal of each of the first thin film transistors being connected to a first terminal of the display driving unit for receiving a common electrode switching signal from the display driving unit, an input terminal of each of the first thin film transistors being connected to a second terminal of the display driving unit for receiving the common electrode driving signal from the display driving unit, and an output terminal of each of the first thin film transistors being connected to the common electrode layer and to an output terminal of the touch driving unit.

3. The touch screen according to claim 1, further comprising a timing control unit configured to provide a timing control signal to the display driving unit and the touch driving unit, so as to synchronize the display driving unit with the touch driving unit.

4. The touch screen according to claim 3, wherein the display driving unit, the touch driving unit and the timing control unit are integrated and arranged outside the array substrate, and are connected to the array substrate by means of a flexible printed circuit board.

5. The touch screen according to claim 3, wherein the touch driving unit and the timing control unit are integrated and arranged outside the array substrate, and are connected to the array substrate by means of a flexible printed circuit board.

6. The touch screen according to claim 3, wherein the second switching unit and the display driving unit are arranged on the array substrate.

7. The touch screen according to claim 1, wherein the second switching unit and the display driving unit are arranged on the array substrate.

8. The touch screen according to claim 1, wherein a magnitude of the touch electrode driving signal is dependent on a magnitude of the common electrode driving signal.

9. A display device, comprising a touch screen comprising:
an array substrate having a common electrode layer;
a display driving unit configured to provide a common electrode driving signal;
a touch driving unit configured to provide a touch electrode driving signal,
wherein the array substrate further comprises a first switching unit configured to switch so as to output the common electrode driving signal to the common electrode layer,
the touch screen further comprises a second switching unit configured to output the touch electrode driving signal provided by the touch driving unit to the common electrode layer, wherein the common electrode driving signal and the touch electrode driving signal are time-division output to the common electrode layer,
wherein the first switching unit comprises a plurality of first thin film transistors, a control terminal of each of the first thin film transistors being connected to a first terminal of the display driving unit for receiving a common electrode switching signal from the display driving unit, an input terminal of each of the first thin film transistors being connected to a second terminal of the display driving unit for receiving the common electrode driving signal from the display driving unit, and an output terminal of each of the first thin film transistors being connected to the common electrode layer and to an output terminal of the touch driving unit.

10. A time-division driving method applied to the touch screen according to claim 1, comprising:
turning on the first switching unit and turning off the second switching unit during a display period of each frame displayed by the touch screen, and outputting the common electrode driving signal to the common electrode layer in order to perform display screen refresh on the touch screen; and turning off the first switching unit and turning on the second switching unit during a touch period of each frame displayed by the touch screen, and outputting the touch electrode driving signal to the common electrode layer in order to perform touch scan on the touch screen.

11. The display device according to claim 9, wherein the touch screen further comprises a timing control unit configured to provide a timing control signal to the display driving unit and the touch driving unit, so as to synchronize the display driving unit with the touch driving unit.

12. The display device according to claim 11, wherein the display driving unit, the touch driving unit and the timing control unit are integrated and arranged outside the array substrate, and are connected to the array substrate by means of a flexible printed circuit board.

13. The display device according to claim 9, wherein the second switching unit and the display driving unit are arranged on the array substrate.

14. The display device according to claim 11, wherein the touch driving unit and the timing control unit are integrated and arranged outside the array substrate, and are connected to the array substrate by means of a flexible printed circuit board.

15. The display device according to claim 9, wherein the second switching unit comprises a plurality of second thin film transistors, a control terminal of each of the second thin film transistors receiving a touch electrode switching signal from the display driving unit, an input terminal of each of the second thin film transistors receiving a respective one of a plurality of touch electrode driving signals generated by the touch driving unit, and an output terminal of each of the second thin film transistors being connected to the common electrode layer.

16. The display device according to claim 9, wherein a magnitude of the touch electrode driving signal is dependent on a magnitude of the common electrode driving signal.

* * * * *